(12) United States Patent
Tsuruta

(10) Patent No.: US 11,417,547 B1
(45) Date of Patent: Aug. 16, 2022

(54) PEELING APPARATUS

(71) Applicant: DISCO CORPORATION, Tokyo (JP)

(72) Inventor: Gentaro Tsuruta, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 17/649,125

(22) Filed: Jan. 27, 2022

(30) Foreign Application Priority Data

Feb. 16, 2021 (JP) .............................. JP2021-022492

(51) Int. Cl.
*B32B 43/00* (2006.01)
*H01L 21/67* (2006.01)
*H01L 21/683* (2006.01)

(52) U.S. Cl.
CPC .... *H01L 21/67132* (2013.01); *H01L 21/6836* (2013.01); *B32B 43/006* (2013.01); *H01L 2221/68327* (2013.01); *H01L 2221/68386* (2013.01); *Y10T 156/1132* (2015.01); *Y10T 156/1168* (2015.01); *Y10T 156/1944* (2015.01); *Y10T 156/1978* (2015.01)

(58) Field of Classification Search
CPC ......... Y10T 156/1132; Y10T 156/1168; Y10T 156/1944; Y10T 156/1978
See application file for complete search history.

(56) References Cited

U.S. PATENT DOCUMENTS

| 4,828,640 A * | 5/1989 | Kaya | G03F 1/64 430/4 |
| 5,676,789 A * | 10/1997 | Hamamura | G03F 7/161 156/714 |
| 6,227,276 B1 * | 5/2001 | Kim | B29C 63/0013 156/247 |
| 6,503,130 B2 * | 1/2003 | Lim | B24B 37/34 156/716 |
| 6,656,320 B2 * | 12/2003 | Ong | H01L 21/6835 156/941 |
| 8,756,783 B2 * | 6/2014 | Lu | B23P 19/04 156/247 |
| 9,102,430 B2 * | 8/2015 | Monti | B65B 69/0033 |
| 9,227,812 B2 * | 1/2016 | Degawa | B65H 37/00 |
| 9,315,006 B2 * | 4/2016 | Lee | B32B 38/10 |
| 9,902,584 B2 * | 2/2018 | Kramer | B65H 20/16 |

(Continued)

FOREIGN PATENT DOCUMENTS

JP      2018198290 A     12/2018

*Primary Examiner* — Philip C Tucker
*Assistant Examiner* — Nickolas R Harm
(74) *Attorney, Agent, or Firm* — Greer Burns & Crain Ltd.

(57) ABSTRACT

A peeling apparatus includes a discarding unit configured to discard a protective member by stacking the protective member in a trash box. The discarding unit includes an inclined dropping unit configured to drop the protective member obliquely downward to an opening of the trash box, and a first inclined plate and a second inclined plate that arranged so as to face each other in a direction orthogonal to a traveling direction of the protective member when the protective member dropping obliquely downward above the opening is viewed from above. The first inclined plate and the second inclined plate are arranged such that a gap through which the protective member can pass is formed between a lower side of the first inclined plate and a lower side of the second inclined plate, and the first inclined plate and the second inclined plate are inclined.

8 Claims, 7 Drawing Sheets

(56) References Cited

U.S. PATENT DOCUMENTS

| | | | | |
|---|---|---|---|---|
| 11,001,044 | B2* | 5/2021 | Makino | B32B 43/006 |
| 2006/0113595 | A1* | 6/2006 | Ohkawara | H01L 21/67132 |
| | | | | 257/347 |
| 2013/0133839 | A1* | 5/2013 | Seo | B32B 43/006 |
| | | | | 156/759 |
| 2014/0076501 | A1* | 3/2014 | Kim | B32B 43/006 |
| | | | | 156/760 |
| 2015/0261206 | A1* | 9/2015 | Shiino | G05B 19/409 |
| | | | | 700/257 |
| 2017/0326865 | A1* | 11/2017 | Ayabe | B32B 43/006 |
| 2017/0358468 | A1* | 12/2017 | Fukushi | H01L 21/67115 |
| 2020/0290337 | A1* | 9/2020 | Jung | B32B 37/12 |

* cited by examiner

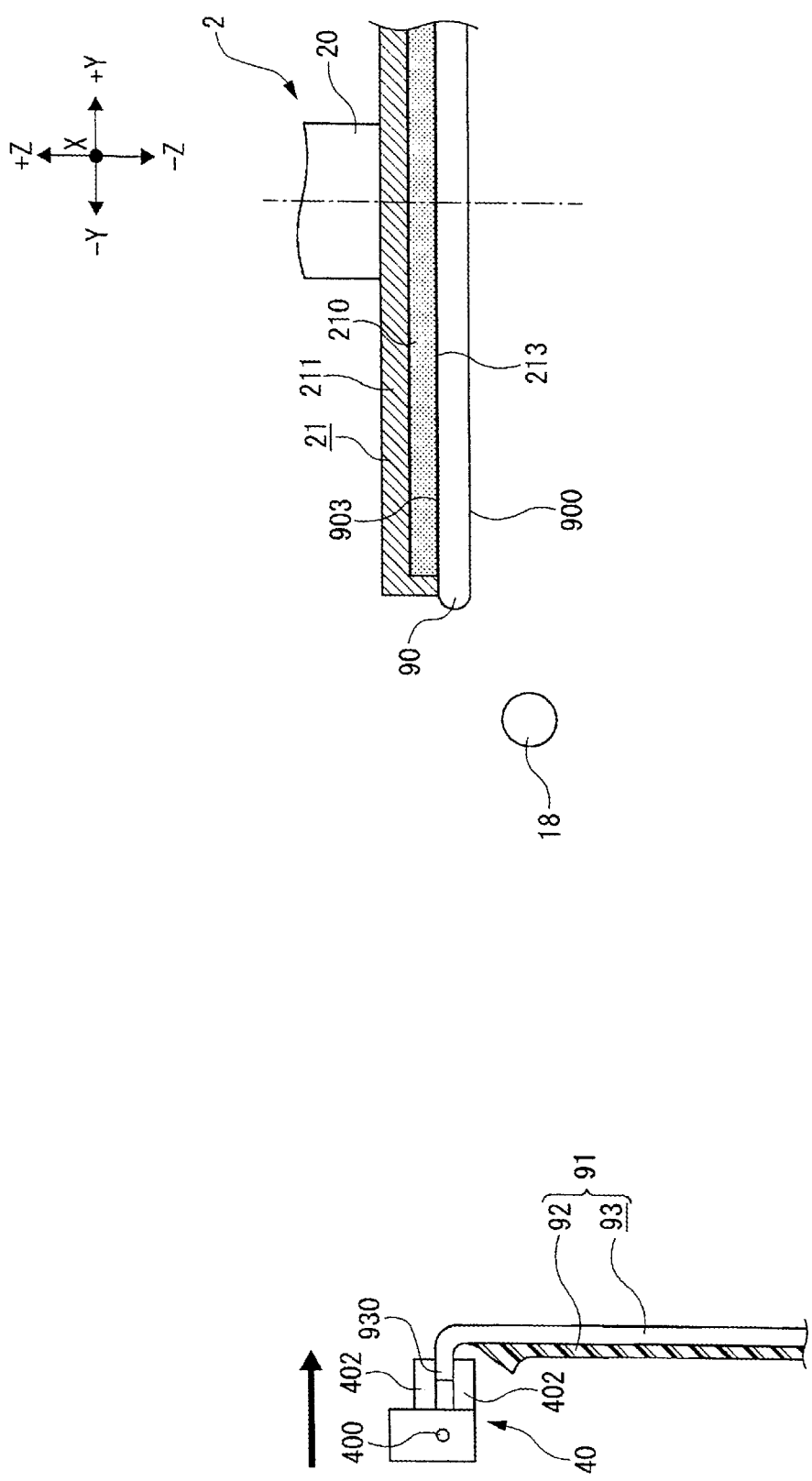

PEELING APPARATUS

BACKGROUND OF THE INVENTION

Field of the Invention

The present invention relates to a peeling apparatus for peeling a protective member from a wafer and discarding the protective member into a trash box.

Description of the Related Art

In a case where a wafer having a flat surface is to be fabricated in a semiconductor wafer manufacturing process, an as-sliced wafer in a disk shape is obtained by, for example, thinly cutting a circular cylinder ingot of silicon or the like with use of a wire saw or the like. An undulation or a warp is present on both sides of the wafer. Thus, the undulation or the warp is removed by making a rotating grinding stone abut against the cut surface of the wafer.

In order to perform grinding processing, a protective member is formed by a liquid resin on one surface of the disk-shaped wafer. This is to accommodate the undulation or the warp of the wafer by the protective member, and hold the wafer flatly under suction by a chuck table of a grinding apparatus. Specifically, a predetermined amount of liquid resin or the like is supplied onto a circular sheet having a larger diameter than that of the wafer. Then, the other surface of the wafer is held under suction by a holding unit, and the wafer is pressed from above against the liquid resin on the sheet that is disposed so as to face the one surface of the wafer. Thus, the liquid resin is spread, and the whole of the one surface of the wafer is covered with a resin layer. A protective member is then formed by curing the resin layer by ultraviolet irradiation, for example. The protective member includes a protruding portion in which the sheet protrudes from the peripheral edge of the wafer.

Thereafter, the wafer is flatly held under suction by the chuck table of the grinding apparatus such that the other surface on which the protective member is not formed is oriented upward. Grinding is then performed by the grinding stone. Thereafter, the protective member is peeled from the wafer by a tape peeling apparatus (see Japanese Patent Laid-Open No. 2018-198290, for example), and the one surface of the wafer which was protected by the protective member is ground. The wafer both surfaces of which are flat can thus be fabricated.

The tape peeling apparatus disclosed in Japanese Patent Laid-Open No. 2018-198290 peels the resin layer from the wafer and discards the peeled protective member into a trash box. Specifically, the peeled protective member is slid downward on two inclined pipes, and is bent and dropped from a space between the two inclined pipes into the trash box located below the pipes. It is thus made possible to put many protective members into the trash box by properly stacking the protective members within the trash box. Because the protective members are thus thrown into the trash box in such a manner as to be stacked in piles, the frequency of work of extracting the protective members from the trash box is decreased, and a burden on a worker is reduced.

SUMMARY OF THE INVENTION

In the tape peeling apparatus described in Japanese Patent Laid-Open No. 2018-198290, the hardness of the cured resin or the thickness of the resin is changed by using different liquid resins depending on the magnitude of unevenness, an undulation, or a warp of the as-sliced wafer. If the hardness or the thickness differs among resins (for example, the hardness and the thickness are increased), a force necessary to bend the protective member on the two pipes under the own weight of the protective member changes, and a degree of bending differs among the protective members when only the two pipes are used. Thus, protective members cannot be passed between the pipes and properly be stacked within the trash box, in some cases.

In such a case, because the protective members are not properly stacked within the trash box, a sensor which is configured to detect that the trash box is filled with protective members detects the protective members improperly stacked within the trash box even though the trash box is not filled with protective members. Consequently, the frequency of extracting the protective members from the trash box by the worker is increased, so that the burden on the worker is increased.

It is accordingly an object of the present invention to provide a peeling apparatus that peels a protective member from a wafer and that discards the protective member into a trash box, and particularly a peeling apparatus that can discard the protective member by properly stacking the protective member into the trash box even when a force necessary to bend the protective member may change due to a change in hardness of a resin or a change in thickness of the resin.

In accordance with an aspect of the present invention, there is provided a peeling apparatus that peels, from a wafer, a sheet-shaped protective member formed on one surface of the wafer and that discards the protective member by stacking the protective member in a trash box having an opening in an upper surface of the trash box. The peeling apparatus includes a holding unit configured to hold another surface of the wafer under suction on a holding surface, a peeling unit configured to peel, from the wafer, the protective member formed on the wafer held by the holding unit, and a discarding unit configured to discard the protective member by stacking the protective member in the trash box. The peeling unit includes a gripping unit configured to grip a peripheral edge of the protective member and a moving unit configured to move the gripping unit and the holding unit relative to each other so as to make the gripping unit and the holding unit pass each other in parallel with the holding surface and in a direction from a periphery to a center of the wafer. The discarding unit includes an inclined dropping unit configured to drop the protective member gripped by the gripping unit obliquely downward to the opening of the trash box, and a first inclined plate and a second inclined plate that are arranged so as to face each other in a direction orthogonal to a traveling direction of the protective member when the protective member dropping obliquely downward above the opening is viewed from above. The first inclined plate and the second inclined plate are arranged such that a gap through which the protective member can pass is formed between a lower side of the first inclined plate and a lower side of the second inclined plate, and the first inclined plate and the second inclined plate are inclined such that a distance between an upper side of the first inclined plate and an upper side of the second inclined plate is larger than a distance between the lower side of the first inclined plate and the lower side of the second inclined plate. The protective member is bent in a protruding shape toward the trash box when dropping obliquely downward and entering the gap between the first inclined plate and the second inclined plate, and the protective member is stacked in a horizontal orientation within the trash box after passing through the opening of the trash box and further dropping.

Preferably, the first inclined plate and the second inclined plate each have a first air jetting port configured to jet air, the first air jetting port being formed in each of upper surfaces of the first inclined plate and the second inclined plate.

Preferably, the discarding unit further includes two pipes that are arranged individually on a lower end side of the first inclined plate and a lower end side of the second inclined plate and that each have a second air jetting port configured to jet air, and the air jetted from the second air jetting port generates airflow moving upward from below, on an upper surface of the first inclined plate and an upper surface of the second inclined plate.

Preferably, the discarding unit is formed such that an interval between a lower end of the first inclined plate and a lower end of the second inclined plate is smaller on a side far from the inclined dropping unit than the interval on a side close to the inclined dropping unit.

In the peeling apparatus according to one aspect of the present invention, the discarding unit that discards the protective member by stacking the protective member in the trash box includes the inclined dropping unit that drops the protective member gripped by the gripping unit obliquely downward to the opening of the trash box, and the first inclined plate and the second inclined plate that are arranged so as to face each other in the direction orthogonal to the traveling direction of the protective member when the protective member dropping obliquely downward above the opening is viewed from above. The gap through which the protective member can pass is formed between the lower side of the first inclined plate and the lower side of the second inclined plate. The first inclined plate and the second inclined plate are inclined such that the distance between the upper side of the first inclined plate and the upper side of the second inclined plate is larger than the distance between the lower side of the first inclined plate and the lower side of the second inclined plate. Thus, even when a force necessary to bend the protective member may change due to a change in hardness of the protective member or a change in thickness of the protective member, the protective member in contact with the first inclined plate and the second inclined plate is bent in a protruding shape toward the trash box because the protective member dropping obliquely downward enters a space between the first inclined plate and the second inclined plate. Further, a bent part can be widened by the first inclined plate and the second inclined plate according to a position at which the protective member is dropping obliquely downward. Hence, as compared with the conventional peeling apparatus in which only two pipes form the protective member into a protruding shape toward the opening of the trash box, the first inclined plate and the second inclined plate assist the protective member in forming into a protruding shape toward the opening of the trash box from a state in which the protective member is at a position higher than the opening of the trash box. Then, the protective member in a protruding shape passes through the opening of the trash box, assumes a horizontal orientation due to the own elasticity of the protective member while further dropping within the trash box, and is then stacked within the trash box. It is thus possible to discard a sufficient number of protective members by properly stacking the protective members in the trash box.

In a case where the first inclined plate and the second inclined plate have the first air jetting ports, air is jetted from the first air jetting ports, and thus, the air can reduce a friction between the upper surfaces of the first inclined plate and the second inclined plate and the protective member when the protective member is bent in a protruding shape toward the trash box by entry of the protective member dropping obliquely downward between the first inclined plate and the second inclined plate. The protective member can thus be bent in a protruding shape toward the trash box, over the trash box with less resistance.

In a case where the two pipes that are arranged on the respective lower end sides of the first inclined plate and the second inclined plate and that have the second air jetting ports configured to jet air are provided, the air jetted from the second air jetting port generates airflow moving upward from below, on the upper surface of the first inclined plate and the upper surface of the second inclined plate when the center of the protective member is bent in a protruding shape toward the trash box by entry of the protective member dropping obliquely downward between the first inclined plate and the second inclined plate. Thus, the air can reduce the friction between the upper surfaces of the first inclined plate and the second inclined plate and the protective member. The protective member can thus be bent in a protruding shape toward the trash box, over the trash box with less resistance.

In a case where the interval between the lower end of the first inclined plate and the lower end of the second inclined plate is smaller on the side far from the inclined dropping unit than that on the side close to the inclined dropping unit, the speed of the protective member dropping obliquely downward is decreased by the reduced interval between the first inclined plate and the second inclined plate. Thus, the protective member is prevented from passing over the trash box, and the protective member can be bent in a protruding shape and dropped into the trash box.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 5 is a sectional view of assistance in explaining a state in which the peeling of the protective member from the wafer is completed by moving the gripping unit and the holding unit relative to each other by the peeling unit so as to make the gripping unit and the holding unit pass each other;

DETAILED DESCRIPTION OF THE PREFERRED EMBODIMENT

Figure 1:
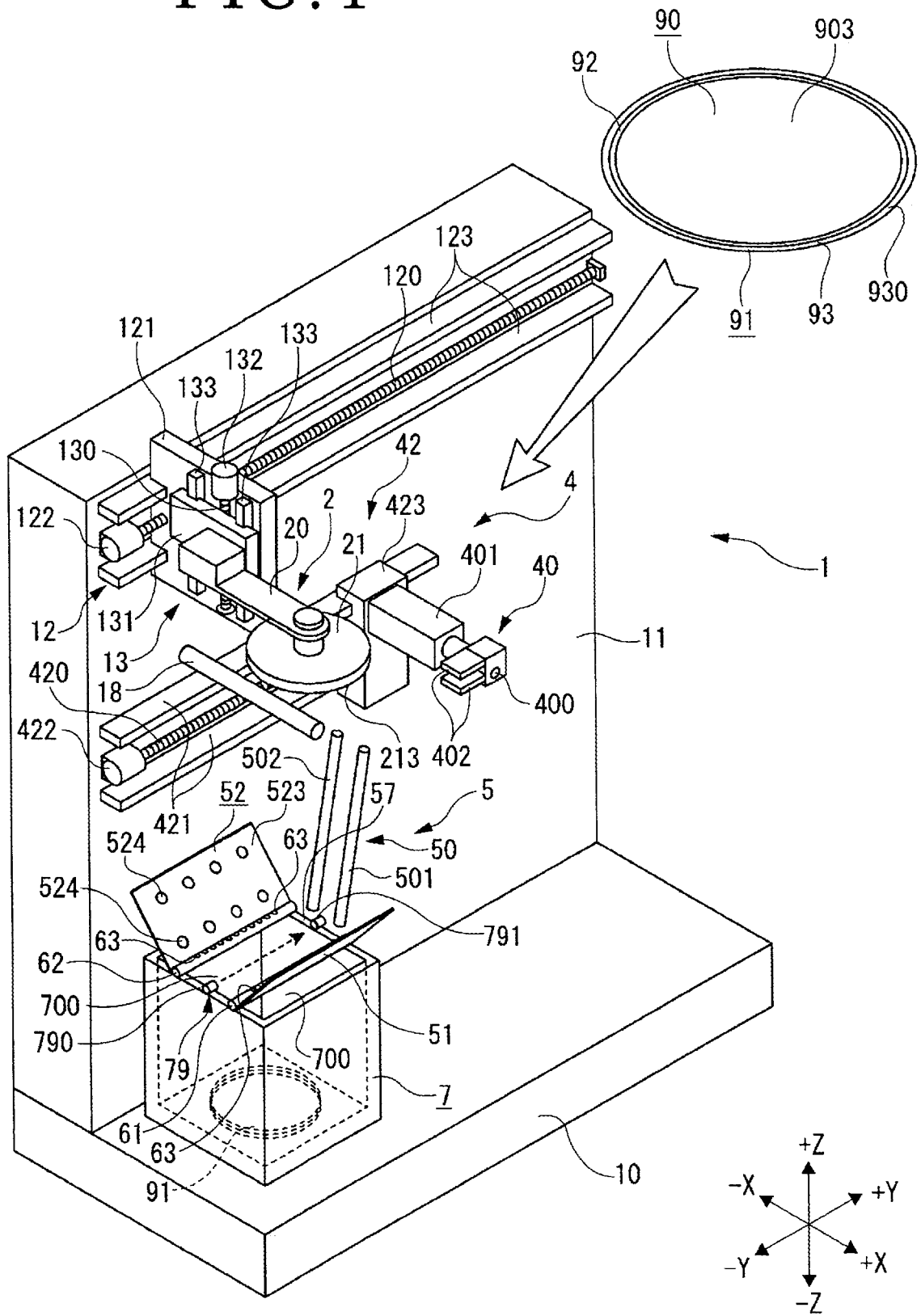
FIG. 1 is a perspective view illustrating an example of a peeling apparatus.
Figure 2:
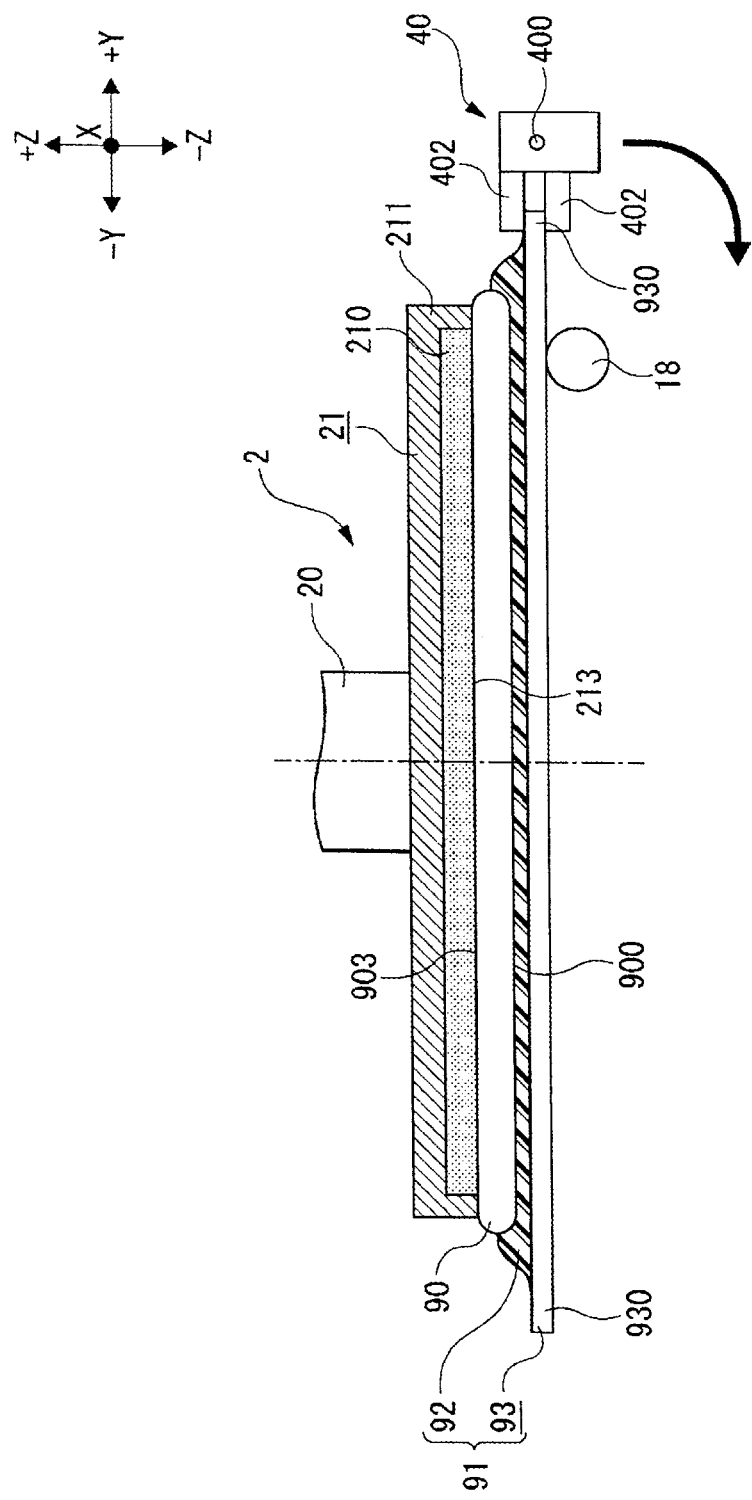
FIG. 2 is a sectional view of assistance in explaining a state in which a gripping unit grips a protruding portion of a protective member.

An embodiment of the present invention will hereinafter be described with reference to the accompanying drawings. A peeling apparatus 1 illustrated in FIG. 1 is an apparatus that peels a protective member 91 in a sheet shape from a wafer 90 such as an as-sliced wafer. The protective member 91 illustrated in FIG. 1 and FIG. 2 has a larger diameter, that is, a wider area, than that of the wafer 90, and includes a resin layer 92 and a sheet 93 fixed to one surface 900 (see FIG. 2) of the wafer 90 via the resin layer 92. The sheet 93 is, for example, a sheet formed of a polyolefin resin. The resin layer 92 is, for example, a resin layer cured by irradiation with ultraviolet rays. As illustrated in FIG. 2, the resin layer 92 covers the whole of the one surface 900 of the wafer 90 and a part of a peripheral surface of the wafer 90. In addition, the sheet 93 has a protruding portion 930 that protrudes outward from the periphery of the wafer 90.

A column 11 is erected on a rear part (−X direction side) of a base 10 of the peeling apparatus 1 illustrated in FIG. 1. On an upper portion of a front surface of the column 11 on a +X direction side, a holding unit moving mechanism 12 is provided. The holding unit moving mechanism 12 slides a movable plate 121 along a pair of guide rails 123 by rotating a ball screw 120 with use of a motor 122, and thus reciprocates, in a Y-axis direction, a holding unit 2 disposed on the movable plate 121.

A holding unit vertical movement mechanism 13 that reciprocates the holding unit 2 in a Z-axis direction is disposed on the movable plate 121. The holding unit vertical movement mechanism 13 reciprocates the holding unit 2 in the Z-axis direction by rotating a ball screw 130 with use of a motor 132, the holding unit 2 being disposed on a movable plate 131 that slides along a pair of guide rails 133 extending in the Z-axis direction (vertical direction).

The holding unit 2 holds, under suction, another surface 903 that is opposite to the one surface 900 of the wafer 90 on which the protective member 91 illustrated in FIG. 2 is formed. The holding unit 2 includes an arm portion 20 whose one end on a proximal side is fixed onto the movable plate 131 illustrated in FIG. 1, and a holding pad 21 that is disposed on a lower surface of a distal end of the arm portion 20 on the +X direction side and that is capable of holding the wafer 90 under suction. As illustrated in FIG. 2, the holding pad 21 includes a suction portion 210 that is formed of a porous plate or the like and that communicates with a suction source not illustrated, and a frame body 211 that supports the suction portion 210. The holding pad 21 holds the other surface 903 of the wafer 90 under suction on a holding surface 213 which is an exposed surface of the suction portion 210 and which is flush with a lower surface of the frame body 211.

As illustrated in FIG. 1, at an intermediate portion of the front surface of the column 11 on the +X direction side, that is, below a movement path of the holding pad 21, a rotating roller 18, a gripping unit 40, and a moving unit 42 are arranged in order from above. The rotating roller 18 has an axis in an X-axis direction. The gripping unit 40 grips the protruding portion 930 which is the peripheral edge of the protective member 91 affixed to the wafer 90 held by the holding unit 2. The moving unit 42 moves the gripping unit 40 in the Y-axis direction parallel with the holding surface 213 of the holding unit 2, to thereby move the gripping unit 40 and the holding unit 2 relative to each other so as to make the gripping unit 40 and the holding unit 2 pass each other in a direction from the outer circumference to the center of the wafer 90. The gripping unit 40 and the moving unit 42 constitute a peeling unit 4 that peels off the protective member 91 formed on the wafer 90 held by the holding unit 2.

The moving unit 42 includes a ball screw 420 having an axis in the Y-axis direction, a pair of guide rails 421 arranged in parallel with the ball screw 420, a motor 422 that rotates the ball screw 420, and a movable block 423 whose internal nut is screwed onto the ball screw 420 and whose side portions are in sliding contact with the guide rails 421. When the motor 422 rotates the ball screw 420, the movable block 423 is correspondingly moved in the Y-axis direction while guided by the guide rails 421, and the gripping unit 40 disposed on the movable block 423 is moved in the Y-axis direction as the movable block 423 is moved.

The gripping unit 40 includes a spindle 400 whose axial direction is the X-axis direction, a housing 401 that rotatably supports the spindle 400, and a gripping clamp 402 disposed at a distal end of the spindle 400 on the +X direction side. The gripping clamp 402 has a pair of gripping plates that can come close to and separate from each other, and can sandwich a gripping object between the gripping plates. The gripping clamp 402 can change an angle thereof with respect to the gripping object by rotation of the spindle 400. Incidentally, the gripping unit 40 may be movable in an upward-downward direction on a front surface of the movable block 423, for example.

The rotating roller 18 is, for example, rotated about an axis in the X-axis direction by a motor not illustrated. The rotating roller 18 plays a role of, for example, preventing a folding of the resin layer 92 illustrated in FIG. 2 by abutting against the protective member 91. The folding can occur at a time of peeling the protective member 91. Incidentally, the rotating roller 18 may be movable in the Y-axis direction.

A trash box 7 that holds the peeled protective member 91 is disposed on the base 10. The trash box 7 has, for example, an external shape formed in substantially a rectangular parallelepiped shape. An opening 700 formed in the upper surface of the trash box 7 is located below a first inclined plate 51 and a second inclined plate 52 of a discarding unit 5 to be described later. As illustrated in FIG. 1, a transmissive optical sensor 79 including, for example, a pair of a light emitting unit 790 (−Y direction side) and a light receiving unit 791 (+Y direction side) is disposed on an upper portion of the trash box 7. The protective member 91 that has been peeled off from the wafer 90 is dropped into the trash box 7 by the discarding unit 5. When the protective members 91 are stacked to a predetermined height within the trash box 7, inspection light between the light emitting unit 790 and the light receiving unit 791 is blocked by the protective members 91, and the amount of light received by the light receiving unit 791 is thus decreased. The optical sensor 79 then detects that the inside of the trash box 7 is filled with the protective members 91.

The peeling apparatus 1 includes the discarding unit 5 for discarding the protective members 91 by stacking the protective members 91 within the trash box 7. The discarding unit 5 includes an inclined dropping unit 50 that drops the protective member 91 gripped by the gripping unit 40, obliquely downward toward the opening 700 of the trash box 7 (inclined dropping), and the first inclined plate 51 and the second inclined plate 52 arranged so as to face each other in a direction (X-axis direction) orthogonal to a traveling direction (−Y direction) of the protective member 91 when the protective member 91 dropping obliquely downward above the opening 700 is viewed from above (+Z direction side).

The inclined dropping unit 50 is, for example, disposed rearwardly upward of the trash box 7 and below the movement path of the gripping unit 40 and the holding pad 21 of the holding unit 2. The inclined dropping unit 50 includes a pair of a guide rail 501 and a guide rail 502 that are inclined downward to the front.

The pair of the guide rail 501 and the guide rail 502 are, for example, formed in a rod shape having a circular cross section. The pair of the guide rail 501 and the guide rail 502 have, for example, substantially the same length as the outside diameter of the protective member 91. Distal end parts of the pair of the guide rail 501 and the guide rail 502 are located, for example, above one side of a rear part (+Y direction side) of the trash box 7. In addition, the pair of the guide rail 501 and the guide rail 502 are arranged symmetrically with respect to a center line of the trash box 7 in the X-axis direction and are arranged in parallel with each other at an interval sufficiently smaller than the diameter of the protective member 91.

It is to be noted that the pair of the guide rail 501 and the guide rail 502 may have a plate shape instead of a rod shape and that the inclined dropping unit 50 may include one inclined solid plate.

Figure 6A:
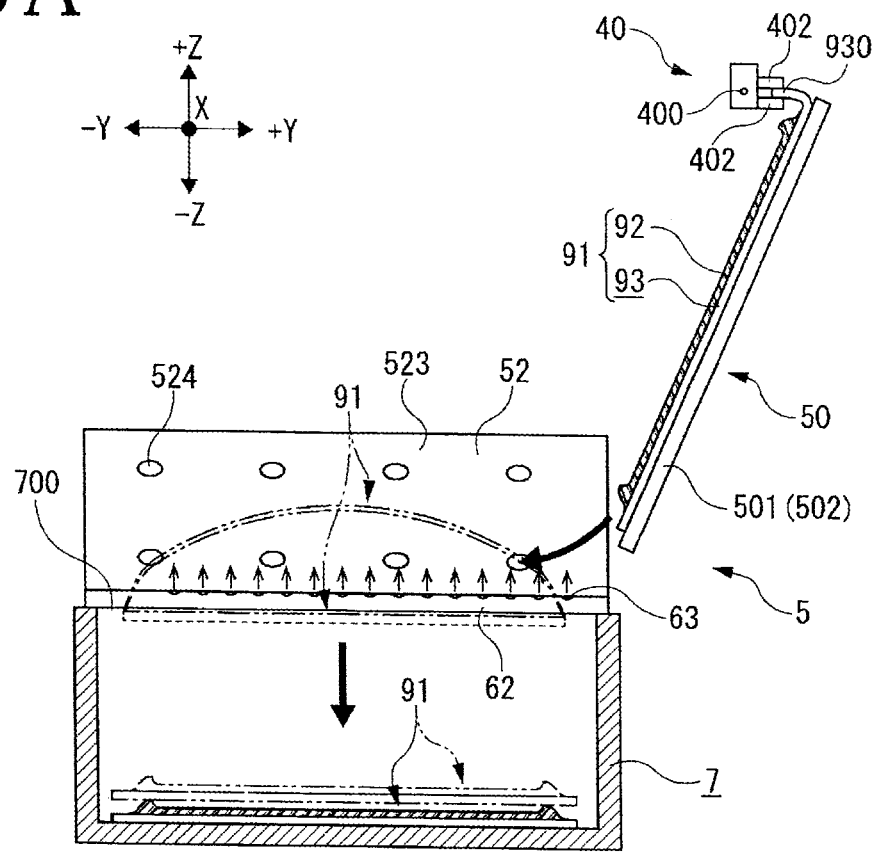
FIG. 6A is a sectional view of assistance in explaining a manner in which the protective member dropping obliquely downward enters a space between a first inclined plate and a second inclined plate, bends in a protruding shape toward a trash box, passes through the opening of the trash box, assumes a horizontal orientation while dropping further, and is stacked within the trash box.
Figure 6B:
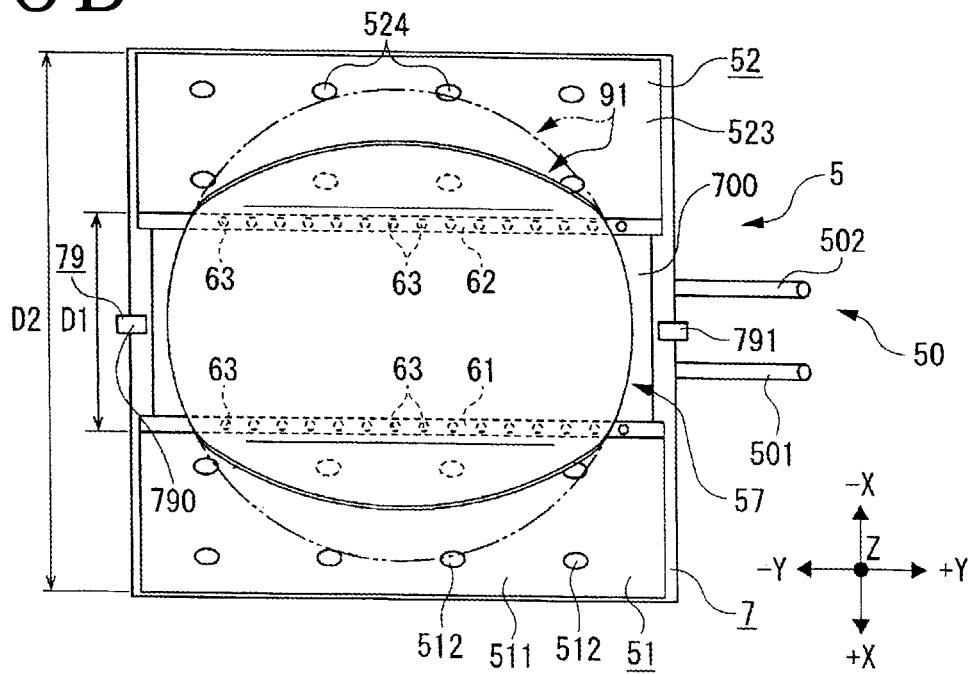
FIG. 6B is a plan view of assistance in explaining the manner in which the protective member dropping obliquely downward enters the space between the first inclined plate and the second inclined plate, bends in a protruding shape toward the trash box, passes through the opening of the trash box, assumes a horizontal orientation while dropping further, and is stacked within the trash box.

The first inclined plate 51 and the second inclined plate 52 illustrated in FIG. 1, FIG. 6A, and FIG. 6B are, for example, formed in a rectangular shape as viewed in plan, and extend from one end to the other end in the Y-axis direction above the opening 700 of the trash box 7. For example, lower edge sides of the first inclined plate 51 and the second inclined plate 52 are positioned in a central region of the opening 700 of the trash box 7 in the X-axis direction. A gap 57 of a predetermined width through which the protective member 91 can pass is formed between the lower side of the first inclined plate 51 and the lower side of the second inclined plate 52. The opening 700 in a rectangular shape as viewed in plan is located below the gap 57.

The first inclined plate 51 and the second inclined plate 52 are inclined such that a distance D2 between the upper side of the first inclined plate 51 and the upper side of the second inclined plate 52 is larger than a distance D1 between the lower side of the first inclined plate 51 and the lower side of the second inclined plate 52 in FIG. 6B. That is, a space between the first inclined plate 51 and the second inclined plate 52 is gradually widened in a +Z direction.

As illustrated in FIG. 1, FIG. 6A, and FIG. 6B, the peeling apparatus 1 according to the present embodiment includes, for example, two pipes, that is, a pipe (horizontal pipe) 61 and a pipe (horizontal pipe) 62 in a straight tubular shape. The pipe 61 and the pipe 62 are arranged horizontally on the respective lower end sides of the first inclined plate 51 and the second inclined plate 52, and have second air jetting ports 63 that jet air.

The two pipes, that is, the pipe 61 and the pipe 62, extend horizontally from an end to the other end in the Y-axis direction above the opening 700 of the trash box 7. The pipe 61 and the pipe 62 are formed in a rod shape having a circular cross section, for example, and extend with a length larger than the outside diameter of the protective member 91. One ends (rear ends) of the pipe 61 and the pipe 62 are fixed to an upper end part of one side of the trash box 7 on a rear side in the Y-axis direction. Other ends (front ends) of the pipe 61 and the pipe 62 are fixed to an upper end part of one side of the trash box 7 on a front side in the Y-axis direction. In addition, in the present embodiment, the lower side of the first inclined plate 51 is connected to the peripheral surface of the pipe 61, and the lower side of the second inclined plate 52 is connected to the peripheral surface of the pipe 62. Incidentally, for example, in a case where the peeling apparatus 1 does not include the pipe 61 nor the pipe 62, the first inclined plate 51 and the second inclined plate 52 may be connected directly to the upper surfaces of side plates of the trash box 7.

In addition, the pipe 61 and the pipe 62 are arranged symmetrically with respect to the center line of the trash box 7 in the X-axis direction at an interval smaller than the outside diameter of the protective member 91, and extend in parallel with the Y-axis direction, for example. The gap 57 between the lower side of the first inclined plate 51 and the lower side of the second inclined plate 52 is also a gap between the pipe 61 and the pipe 62. The protective member 91 passes through the gap 57 and drops into the trash box 7.

The second air jetting ports 63 that jet air upward are arranged at plurality of positions on the upper surfaces of the pipe 61 and the pipe 62 in such a manner as to be aligned with one another in a longitudinal direction, for example. While the second air jetting ports 63 are formed in the shape of circular holes, the second air jetting ports 63 may be formed in the shape of slits of a small width, or the second air jetting ports 63 may be formed in the shape of one slit extending continuously from substantially an end to substantially the other end in each of the upper surfaces of the two pipes, that is, the pipe 61 and the pipe 62. An air supply source including a compressor not illustrated or the like communicates with each of the second air jetting ports 63. The air jetted from the second air jetting ports 63 flows upward along an upper surface 511 of the first inclined plate 51 (upper surface 523 of the second inclined plate 52).

In addition, the bending of the protective member 91 may be facilitated by increasing the amount of the air jetted from the second air jetting ports 63 and forming a large part between the first inclined plate 51 and the second inclined plate 52 where the protective member 91 enters after being guided by the pair of the guide rail 501 and the guide rail 502.

The first inclined plate 51 has, for example, first air jetting ports 512 in the upper surface 511 as an inclined surface, the first air jetting ports 512 jetting air from the upper surface 511. Similarly, the second inclined plate 52 has first air jetting ports 524 in the upper surface 523 as an inclined surface, the first air jetting ports 524 jetting air from the upper surface 523.

The first air jetting ports 512 are opened in the upper surface 511 and arranged at a plurality of positions in such a manner as to be aligned with one another longitudinally and laterally, for example. The first air jetting ports 524 are opened in the upper surface 523 and arranged at a plurality of positions in such a manner as to be aligned with one another longitudinally and laterally, for example. While the first air jetting ports 512 and the first air jetting ports 524 in the example illustrated in FIG. 6B are formed in the shape of circle holes, the first air jetting ports 512 and the first air jetting ports 524 may be formed in the shape of slits of a small width, or the first air jetting ports 512 and the first air jetting ports 524 may be formed in the shape of one slit extending continuously from substantially an end to substantially the other end in the Y-axis direction in the upper surface 511 of the first inclined plate 51 or the upper surface 523 of the second inclined plate 52. For example, the first air jetting ports 512 merge into one flow passage within the first inclined plate 51, and then communicate with an air supply source including a compressor not illustrated or the like, via a joint, a resin tube, or the like provided in the flow passage. For example, the first air jetting ports 524 merge into one flow passage within the second inclined plate 52, and then communicate with an air supply source including a compressor not illustrated or the like, via a joint, a resin tube, or the like provided in the flow passage.

Incidentally, the first air jetting ports 512 may be formed in approximately the same size as the second air jetting ports 63.

In the following, description will be made regarding operation of the peeling apparatus 1 when the peeling apparatus 1 illustrated in FIG. 1 peels the protective member 91 from the wafer 90 and discards the protective member 91.

First, as illustrated in FIG. 1, the wafer 90 that has been ground is mounted on a transfer table, not illustrated, of the peeling apparatus 1 such that the other surface 903 that has been ground is oriented upward. The holding unit moving mechanism 12 moves the holding unit 2 in the Y-axis direction, and positions the holding unit 2 above the wafer 90 such that the center of the holding surface 213 of the holding pad 21 substantially coincides with the center of the other surface 903 of the wafer 90, as illustrated in FIG. 2. Further, the holding unit vertical movement mechanism 13 lowers the holding unit 2, and brings the holding surface 213 into contact with the other surface 903 of the wafer 90. The holding surface 213 to which a suction force is transmitted holds the other surface 903 of the wafer 90 under suction with the protective member 91 oriented downward.

As illustrated in FIG. 2, the holding unit moving mechanism 12 moves the holding unit 2 holding the wafer 90 under suction, in the Y-axis direction until the holding unit 2 is positioned above the rotating roller 18. Further, the holding unit 2 is lowered, and the side surface of the rotating roller 18 is made to abut against the vicinity of a peripheral portion of the lower surface of the sheet 93 of the protective member 91 on the +Y direction side. In addition, the moving unit 42 moves the gripping unit 40 in a −Y direction, and the gripping clamp 402 grips the protruding portion 930.

Figure 3:
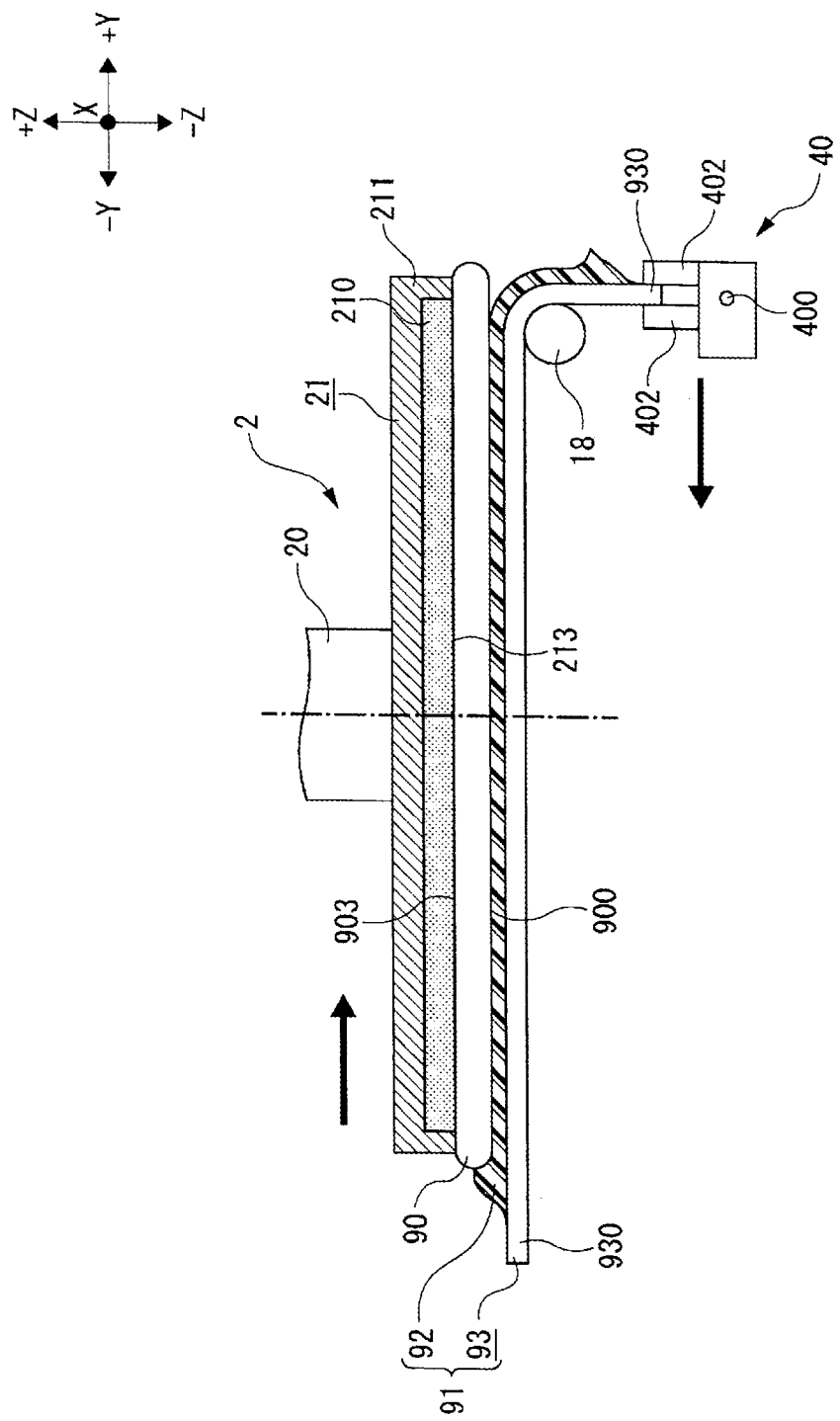
FIG. 3 is a sectional view of assistance in explaining a state in which the protective member starts to be peeled off in a direction from the outer circumferential side to the center of a wafer by moving the gripping unit and a holding unit relative to each other by a peeling unit so as to make the gripping unit and the holding unit pass each other.

For example, after the gripping clamp 402 grips the protruding portion 930, the protruding portion 930 is rotated by 90 degrees in a clockwise direction as viewed from the +X direction side, as illustrated in FIG. 2. The protective member 91 is thus pulled by the gripping clamp 402 in a −Z direction while the resin layer 92 of the protective member 91 is gently bent so as to conform to the side surface of the rotating roller 18 in a state in which the rotating roller 18 supports the lower surface of the protective member 91. A part of the protective member 91 is consequently peeled from the one surface 900 of the wafer 90. That is, the protective member 91 is bent substantially at a right angle while abutting against the rotating roller 18, as illustrated in FIG. 3.

Next, the peeling unit 4 illustrated in FIG. 1 moves the gripping unit 40 and the holding unit 2 relative to each other so as to make the gripping unit 40 and the holding unit 2 pass each other in the Y-axis direction. The peeling unit 4 thus peels the protective member 91 from the wafer 90 in a direction from the periphery to the center of the wafer 90. That is, as illustrated in FIG. 3, the moving unit 42 moves the gripping unit 40 in the −Y direction, and the holding unit moving mechanism 12 (see FIG. 1) moves the holding unit 2 in a +Y direction. Further, the rotating roller 18 rotates about the axis in the X-axis direction, and the resin layer 92 of the protective member 91 is gently bent so as to conform to the side surface of the rotating roller 18. Thus, while a state in which a sudden resin folding is suppressed is maintained, the protective member 91 is peeled from the wafer 90 in a direction from the peripheral edge of the wafer 90 on the +Y direction side to the −Y direction side. Incidentally, in a state in which either the holding unit 2 or the gripping unit 40 is stopped, the other unit that moves in the Y-axis direction may peel the protective member 91 from the wafer 90. Alternatively, for example, the gripping unit 40 may continue to be moved downward without being moved in the Y-axis direction, and the protective member 91 may be peeled from the wafer 90 in a state in which the protective member 91 is bent at a right angle.

Figure 4:
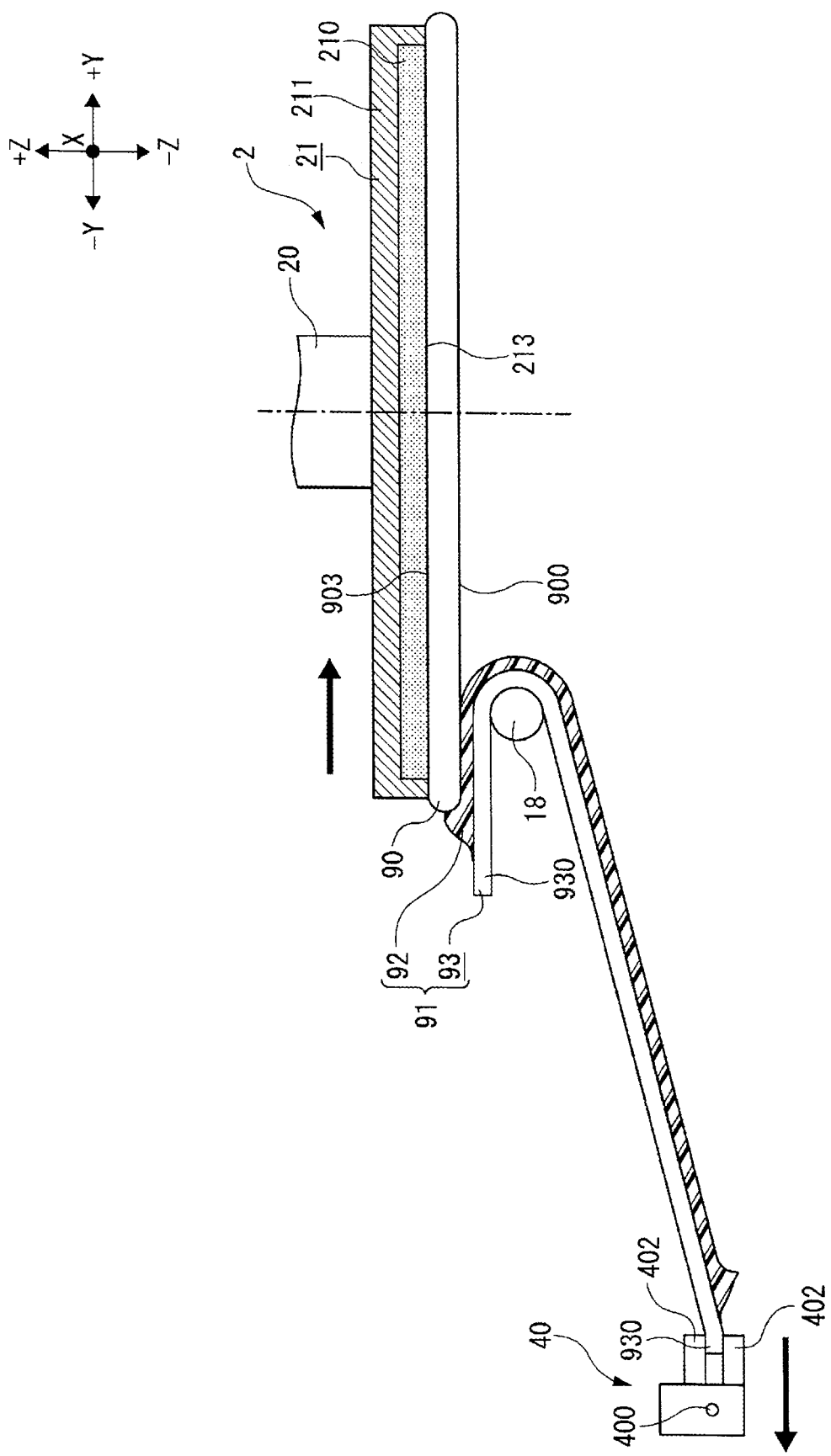
FIG. 4 is a sectional view of assistance in explaining a state in which the peeling of the protective member from the wafer is made to progress by moving the gripping unit and the holding unit relative to each other by the peeling unit so as to make the gripping unit and the holding unit pass each other.

As illustrated in FIG. 4, when the gripping unit 40 is moved to the vicinity of the peripheral edge of the wafer 90 on the −Y direction side, the gripping unit 40 is rotated by 90 degrees in the clockwise direction as viewed from the +X direction side, and the resin layer 92 of the protective member 91 is thus oriented downward. When the peeling unit 4 further moves the gripping unit 40 and the holding unit 2 relative to each other in the Y-axis direction, the protective member 91 is completely peeled from the wafer 90, as illustrated in FIG. 5. Then, the protective member 91 gripped by the gripping unit 40 hangs down in a downward direction from the gripping unit 40.

When the protective member 91 is completely peeled from the wafer 90 as described above, as illustrated in FIG. 6A, the gripping unit 40 gripping the protruding portion 930 is positioned in the vicinity of the inclined dropping unit 50 by the moving unit 42 (see FIG. 1), and the sheet 93 of the protective member 91 is made to abut against the inclined surfaces of the pair of the guide rail 501 and the guide rail 502 of the inclined dropping unit 50. The protective member 91 is thus inclined along the pair of the guide rail 501 and the guide rail 502 with respect to the Z-axis direction.

The gripping of the protruding portion 930 by the gripping unit 40 is released in a state in which the protective member 91 is placed along the pair of the guide rail 501 and the guide rail 502 of the inclined dropping unit 50. The protective member 91 drops obliquely downward (inclined dropping) along the pair of the guide rail 501 and the guide rail 502 due to an own weight of the protective member 91. At a position on the distal end side of the pair of the guide rail 501 and the guide rail 502 and above the opening 700 of the trash box 7, the first inclined plate 51 and the second inclined plate 52 are located so as to face each other in the X-axis direction. Thus, the traveling direction of the protective member 91 that includes the sheet 93 in contact with the upper surface 511 of the first inclined plate 51 and the upper surface 523 of the second inclined plate 52 is gradually converted from an obliquely downward direction to a horizontal direction (−Y direction) due to momentum at the time of dropping obliquely downward.

In addition, when the protective member 91 in contact with the upper surface 511 of the first inclined plate 51 and the upper surface 523 of the second inclined plate 52 drops obliquely downward, a central part of the protective member 91 in the X-axis direction sinks along the upper surface 511 of the first inclined plate 51 and the upper surface 523 of the second inclined plate 52, which are inclined at a predetermined angle, due to the own weight of the protective member 91, and the protective member 91 is thus bent in a U-shape as viewed from the front on the −Y direction side, that is, in a protruding shape toward the trash box 7.

In the present embodiment, for example, air is jetted from the first air jetting ports 512 of the upper surface 511 of the first inclined plate 51 and the first air jetting ports 524 of the upper surface 523 of the second inclined plate 52. Consequently, a friction acting between the upper surface 511 of the first inclined plate 51 and the protective member 91 and a friction acting between the upper surface 523 of the second inclined plate 52 and the protective member 91 are reduced by the air flowing between the upper surface 511 of the first inclined plate 51 and the protective member 91 and between the upper surface 523 of the second inclined plate 52 and the protective member 91. Therefore, the protective member 91 is easily bent in a protruding shape toward the trash box 7.

In the present embodiment, for example, air is jetted from the second air jetting ports 63 of the pipe 61 and the second air jetting ports 63 of the pipe 62 illustrated in FIG. 6A and FIG. 6B. The air thus flows upward along the upper surface 511 of the first inclined plate 51 and the upper surface 523 of the second inclined plate 52. Consequently, the friction acting between the upper surface 511 of the first inclined plate 51 and the protective member 91 and the friction acting between the upper surface 523 of the second inclined plate 52 and the protective member 91 are reduced by the air flowing between the upper surface 511 of the first inclined plate 51 and the protective member 91 and between the upper surface 523 of the second inclined plate 52 and the protective member 91. Therefore, the protective member 91 is more easily bent in a protruding shape toward the trash box 7. In addition, the air flowing upward along the upper surface 511 and the upper surface 523 blows an outer circumferential part of the protective member 91 upward, and thus further promotes the bending of the protective member 91 in a protruding shape toward the trash box 7.

Incidentally, air may be jetted from the second air jetting ports 63 of the pipe 61 and the pipe 62 while air is jetted from the first air jetting ports 512 of the upper surface 511 of the first inclined plate 51 and the first air jetting ports 524 of the upper surface 523 of the second inclined plate 52.

As illustrated in FIG. 6A and FIG. 6B, the protective member 91 the whole of which is mounted on the first inclined plate 51 and on the second inclined plate 52 drops while the center of the protective member 91 in the X-axis direction is bent in a protruding shape toward the opening 700 of the trash box 7. Then, the protective member 91 passes through the gap 57 between the lower side of the first inclined plate 51 and the lower side of the second inclined plate 52, that is, the opening 700 of the trash box 7 between the pipe 61 connected to the lower side of the first inclined plate 51 and the pipe 62 connected to the lower side of the second inclined plate 52. Then, while the protective member 91 drops within the trash box 7, the protective member 91 gradually returns, due to elasticity, from the bent shape in which the center of the protective member 91 in the X-axis direction is in a protruding shape, to an original horizontal shape, that is, a horizontal orientation parallel with a flat bottom surface of the trash box 7. As a result, a plurality of protective members 91 can be stacked in the horizontal orientation within the trash box 7.

As described above, in the peeling apparatus 1 for peeling the sheet-shaped protective member 91 formed on the one surface 900 of the wafer 90 from the wafer 90 and discarding the protective member 91 by stacking the protective member 91 in the trash box 7 having the opening 700 in an upper surface of the trash box 7, the discarding unit 5 that discards the protective member 91 by stacking the protective member 91 in the trash box 7 includes the inclined dropping unit 50 that drops the protective member 91 gripped by the gripping unit 40 obliquely downward to the opening 700 of the trash box 7, and the first inclined plate 51 and the second inclined plate 52 arranged so as to face each other in a direction orthogonal to a traveling direction of the protective member 91 when the protective member 91 dropping obliquely downward above the opening 700 is viewed from above. The gap 57 through which the protective member 91 can pass is formed between the lower side of the first inclined plate 51 and the lower side of the second inclined plate 52. The first inclined plate 51 and the second inclined plate 52 are inclined such that the distance between the upper side of the first inclined plate 51 and the upper side of the second inclined plate 52 is larger than the distance between the lower side of the first inclined plate 51 and the lower side of the second inclined plate 52. Thus, even when a force necessary to bend the protective member 91 may change due to a change in hardness of the protective member 91 or a change in thickness of the protective member 91, the protective member 91 in contact with the first inclined plate 51 and the second inclined plate 52 is bent in a protruding shape toward the trash box 7 because the protective member 91 dropping obliquely downward enters a space between the first inclined plate 51 and the second inclined plate 52. Further, a bent part can be widened by the first inclined plate 51 and the second inclined plate 52 according to a position at which the protective member 91 is dropping obliquely downward. That is, as compared with the conventional peeling apparatus in which only two pipes on the trash box form the protective member 91 into a protruding shape toward the opening of the trash box, the first inclined plate 51 and the second inclined plate 52 can assist the protective member 91 in forming into a protruding shape toward the opening 700 of the trash box 7 from a state in which the protective member 91 is at a position higher than the opening 700. Then, the protective member 91 in a protruding shape passes through the opening 700 of the trash box 7, assumes a horizontal orientation due to the own elasticity of the protective member 91 while further dropping within the trash box 7, and is then stacked within the trash box 7. It is thus possible to discard a sufficient number of protective members 91 by properly stacking the protective members 91 in the trash box 7.

It is to be noted that the peeling apparatus according to the present invention is not limited to the foregoing embodiment and that the shape and the like of each configuration of the peeling apparatus 1 illustrated in the accompanying drawings are not limited thereto either and can be changed as appropriate within a scope where effects of the present invention can be exerted.

For example, the protective member 91 may be made to drop along the guide rail 501 and the guide rail 502 more easily by forming jetting holes for jetting air in the pair of the guide rail 501 and the guide rail 502 of the inclined dropping unit 50 illustrated in FIG. 1, FIG. 6A, and FIG. 6B.

In addition, for example, the magnitude of the diameter of the first air jetting ports 512 of the upper surface 511 of the first inclined plate 51 and the first air jetting ports 524 of the upper surface 523 of the second inclined plate 52 or the magnitude of the diameter of the second air jetting ports 63 of the pipe 61 and the pipe 62 may be increased with increasing distance from the inclined dropping unit 50. Thus, the air is gradually increased with increasing distance from the inclined dropping unit 50 and decelerates the protective member 91 so as to prevent the protective member 91 from passing beyond the trash box 7.

For example, an interval between a lower end of the first inclined plate 51 and a lower end of the second inclined plate 52 may be set to be smaller on the −Y direction side which is far from the inclined dropping unit 50, than the interval on the +Y direction side which is close to the inclined dropping unit 50. Specifically, for example, as illustrated in FIG. 7B, the pipe 61 to which the lower side of the first inclined plate 51 is connected and the pipe 62 to which the lower side of the second inclined plate 52 is connected are arranged such that an interval D5 therebetween on a distal end side (−Y direction side far from the inclined dropping unit 50) is smaller than an interval D4 therebetween on a rear end side (+Y direction side close to the inclined dropping unit 50).

Figure 7A:
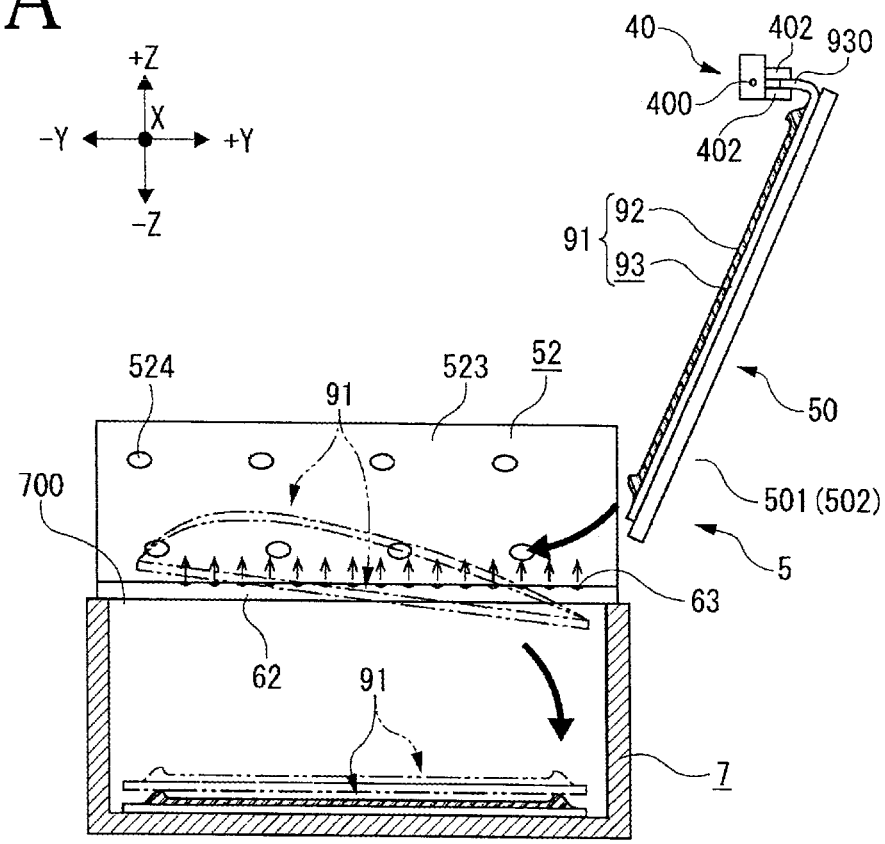
FIG. 7A is a sectional view of assistance in explaining a manner in which, in a case where an interval between a lower end of the first inclined plate and a lower end of the second inclined plate is smaller on a side far from an inclined dropping unit than that on a side close to the inclined dropping unit, the protective member dropping obliquely downward enters the space between the first inclined plate and the second inclined plate, bends in a protruding shape toward the trash box, passes through the opening of the trash box, assumes a horizontal orientation while dropping further, and is stacked within the trash box.
Figure 7B:
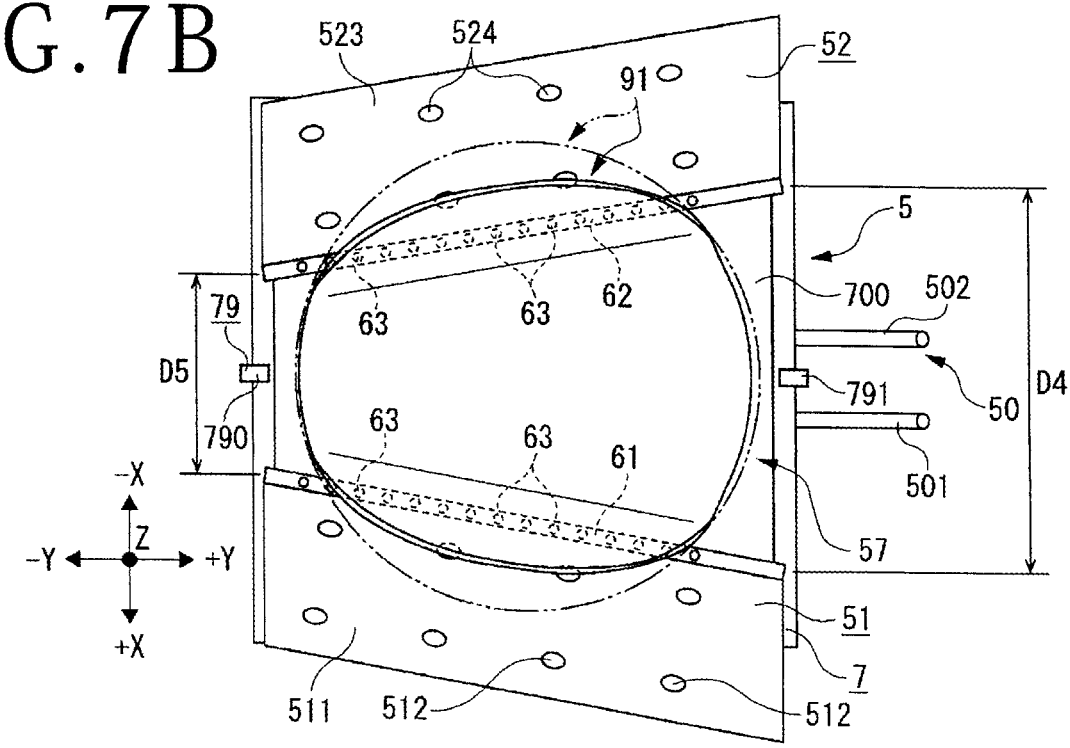
FIG. 7B is a plan view of assistance in explaining the manner in which, in the case where the interval between the lower end of the first inclined plate and the lower end of the second inclined plate is smaller on the side far from the inclined dropping unit than that on the side close to the inclined dropping unit, the protective member dropping obliquely downward enters the space between the first inclined plate and the second inclined plate, bends in a protruding shape toward the trash box, passes through the opening of the trash box, assumes a horizontal orientation while dropping further, and is stacked within the trash box.

As illustrated in FIG. 7A, the gripping unit 40 gripping the protective member 91 releases the gripping of the protruding portion 930 in a state in which the protective member 91 is set along the pair of the guide rail 501 and the guide rail 502 of the inclined dropping unit 50. The protective member 91 then drops obliquely downward (inclined dropping) along the pair of the guide rail 501 and the guide rail 502 due to the own weight of the protective member 91. Two inclined plates, that is, the first inclined plate 51 and the second inclined plate 52, facing each other in the X-axis direction are located on the distal end side of the pair of the guide rail 501 and the guide rail 502. Thus, the traveling direction of the protective member 91 that includes the sheet 93 in contact with the upper surface 511 of the first inclined plate 51 and the upper surface 523 of the second inclined plate 52 is gradually converted from an obliquely downward direction to a horizontal direction due to momentum at the time of dropping obliquely downward.

In addition, when the protective member 91 in contact with the upper surface 511 of the first inclined plate 51 and the upper surface 523 of the second inclined plate 52 drops obliquely downward, a central part of the protective member 91 in the X-axis direction sinks along the upper surface 511 of the first inclined plate 51 and the upper surface 523 of the second inclined plate 52, which are inclined at a predetermined angle, due to the own weight of the protective member 91, and the protective member 91 is thus bent in a protruding shape toward the trash box 7. Incidentally, the friction of the protective member 91 against the upper surface 511 and the upper surface 523 may be reduced by air jetted from the first air jetting ports 512 of the upper surface 511 of the first inclined plate 51 and the first air jetting ports 524 of the upper surface 523 of the second inclined plate 52. In addition, the friction of the protective member 91 against the upper surface 511 and the upper surface 523 may be reduced by air jetted from the second air jetting ports 63 of each of the pipe 61 and the pipe 62 illustrated in FIG. 7A and FIG. 7B.

Because the interval between the lower end of the first inclined plate 51 and the lower end of the second inclined plate 52 is smaller on the side far from the inclined dropping unit 50 than that on the side close to the inclined dropping unit 50, the smaller interval between the first inclined plate 51 and the second inclined plate 52 decreases the speed of the protective member 91 in the traveling direction (−Y direction) in a horizontal plane, so that the protective member 91 is prevented from passing over the trash box 7. Further, the protective member 91 can be bent in a protruding shape and dropped into the trash box 7.

Because the interval between the lower end of the first inclined plate 51 and the lower end of the second inclined plate 52 is smaller on the side far from the inclined dropping unit 50 than that on the side close to the inclined dropping unit 50, when the protective member 91 is dropping while bent in a protruding shape toward the trash box 7, the rear side (+Y direction side) of the protective member 91 in the traveling direction thereof as viewed from the upper side first sinks below the opening 700 between the pipe 61 and the pipe 62, and then, the front side (−Y direction side) of the protective member 91 sinks below the opening 700 between the two pipes, that is, the pipe 61 and the pipe 62. Then, the protective member 91 drops within the trash box 7 while gradually returning the protruding shape to the original horizontal shape within the trash box 7 due to elasticity. Thus, a plurality of protective members 91 can be stacked in the horizontal orientation within the trash box 7.

Incidentally, the pair of the guide rail 501 and the guide rail 502 may be separated from each other at the same distance as the distance D1 illustrated in FIG. 6B or the distance D4 illustrated in FIG. 7B. In addition, the protective member 91 may be guided to a position above the trash box 7 by one inclined plate instead of the pair of guide rails.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A peeling apparatus that peels, from a wafer, a sheet-shaped protective member formed on one surface of the wafer and that discards the protective member by stacking the protective member in a trash box having an opening in an upper surface of the trash box, the peeling apparatus comprising:
   a holding unit configured to hold another surface of the wafer under suction on a holding surface;
   a peeling unit configured to peel, from the wafer, the protective member formed on the wafer held by the holding unit; and
   a discarding unit configured to discard the protective member by stacking the protective member in the trash box, wherein
   the peeling unit includes a gripping unit configured to grip a peripheral edge of the protective member, and a moving unit configured to move the gripping unit and the holding unit relative to each other so as to make the gripping unit and the holding unit pass each other in parallel with the holding surface and in a direction from a periphery to a center of the wafer, the discarding unit includes an inclined dropping unit configured to drop the protective member gripped by the gripping unit obliquely downward to the opening of the trash box, and a first inclined plate and a second inclined plate that are arranged so as to face each other in a direction orthogonal to a traveling direction of the protective member when the protective member dropping obliquely downward above the opening is viewed from above, the first inclined plate and the second inclined plate are arranged such that a gap through which the protective member is allowed to pass is formed between a lower side of the first inclined plate and a lower side of the second inclined plate, and the first inclined plate and the second inclined plate are inclined such that a distance between an upper side of the first inclined plate and an upper side of the second inclined plate is larger than a distance between the lower side of the first inclined plate and the lower side of the second inclined plate, and the protective member is bent in a protruding shape toward the trash box when dropping obliquely downward and entering the gap between the first inclined plate and the second inclined plate, and the protective member is stacked in a horizontal orientation within the trash box after passing through the opening of the trash box and further dropping.

2. The peeling apparatus according to claim 1, wherein the first inclined plate and the second inclined plate each have a first air jetting port configured to jet air, the first air jetting port being formed in each of upper surfaces of the first inclined plate and the second inclined plate.

3. The peeling apparatus according to claim 2, wherein the discarding unit further includes two pipes that are arranged individually on a lower end side of the first inclined plate and a lower end side of the second inclined plate and that each have a second air jetting port configured to jet air, and the air jetted from the second air jetting port generates airflow moving upward from below, on an upper surface of the first inclined plate and an upper surface of the second inclined plate.

4. The peeling apparatus according to claim 3, wherein the discarding unit is formed such that an interval between a lower end of the first inclined plate and a lower end of the second inclined plate is smaller on a side far from the inclined dropping unit than the interval on a side close to the inclined dropping unit.

5. The peeling apparatus according to claim 2, wherein the discarding unit is formed such that an interval between a lower end of the first inclined plate and a lower end of the second inclined plate is smaller on a side far from the inclined dropping unit than the interval on a side close to the inclined dropping unit.

6. The peeling apparatus according to claim 1, wherein the discarding unit further includes two pipes that are arranged individually on a lower end side of the first inclined plate and a lower end side of the second inclined plate and that each have a second air jetting port configured to jet air, and the air jetted from the second air jetting port generates airflow moving upward from below, on an upper surface of the first inclined plate and an upper surface of the second inclined plate.

7. The peeling apparatus according to claim 6, wherein the discarding unit is formed such that an interval between a lower end of the first inclined plate and a lower end of the second inclined plate is smaller on a side far from the inclined dropping unit than the interval on a side close to the inclined dropping unit.

8. The peeling apparatus according to claim 1, wherein the discarding unit is formed such that an interval between a lower end of the first inclined plate and a lower end of the second inclined plate is smaller on a side far from the inclined dropping unit than the interval on a side close to the inclined dropping unit.

\* \* \* \* \*